United States Patent
Kim et al.

(10) Patent No.: US 8,735,188 B2
(45) Date of Patent: May 27, 2014

(54) APPARATUS FOR ATOMIC LAYER DEPOSITION WITH SLOPED PURGE INJECTION NOZZLE STRUCTURE

(75) Inventors: Seung-Hun Kim, Hwaseong-si (KR); Sang-Joon Seo, Seoul (KR); Jin-Kwang Kim, Seoul (KR); Jun-Hyuk Cheon, Seoul (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/347,439

(22) Filed: Jan. 10, 2012

(65) Prior Publication Data

US 2013/0005057 A1    Jan. 3, 2013

(30) Foreign Application Priority Data

Jun. 30, 2011    (KR) .................. 10-2011-0064229

(51) Int. Cl.
*H01L 33/52* (2010.01)
(52) U.S. Cl.
USPC  438/26; 257/43; 257/E27.114; 257/E29.068; 257/E21.211; 257/E21.485
(58) Field of Classification Search
USPC ............. 257/43, E27.114, E29.068, E33.059, 257/E21.211, E21.485, E21.24
See application file for complete search history.

(56) References Cited

U.S. PATENT DOCUMENTS

| | | | | |
|---|---|---|---|---|
| 2002/0007790 A1* | 1/2002 | Park | ................. | 118/715 |
| 2006/0045970 A1* | 3/2006 | Seo et al. | ................. | 427/248.1 |
| 2006/0137608 A1* | 6/2006 | Choi et al. | ................. | 118/715 |
| 2012/0000425 A1* | 1/2012 | Park et al. | ................. | 118/724 |
| 2012/0312232 A1* | 12/2012 | Kim et al. | ................. | 118/722 |

FOREIGN PATENT DOCUMENTS

| | | | | |
|---|---|---|---|---|
| KR | 10-2004-0008629 (A) | 1/2004 | | |
| KR | 10-2009-0055435 (A) | 6/2009 | | |
| KR | 10-2010-0077440 (A) | 7/2010 | | |
| KR | 10-2011-0056287 | * 6/2011 | ............ | 16/455 |

* cited by examiner

*Primary Examiner* — Chuong A Luu
*Assistant Examiner* — Rodolfo Fortich
(74) *Attorney, Agent, or Firm* — Knobbe, Martens, Olson & Bear, LLP

(57) ABSTRACT

An atomic layer deposition apparatus and a sealing method of an organic light emitting device using the same are disclosed. In one embodiment, the atomic layer deposition apparatus improves a structure of the purge gas injection nozzle so as to increase the exhaust efficiency of the purge gas in an atomic layer deposition process, which increases a speed of a purge process. As a result, it is possible to improve a deposition speed and a quality of a sealing film when a sealing process for sealing the organic light emitting device is implemented by using the atomic layer deposition.

31 Claims, 6 Drawing Sheets

APPARATUS FOR ATOMIC LAYER DEPOSITION WITH SLOPED PURGE INJECTION NOZZLE STRUCTURE

CROSS-REFERENCE TO RELATED APPLICATIONS

This application claims the benefit of Korean Patent Application No. 10-2011-0064229, filed on Jun. 30, 2011 with the Korean Intellectual Property Office, which is hereby incorporated by reference in its entirety herein.

BACKGROUND

1. Field

The described technology generally relates to an apparatus for atomic layer deposition.

2. Description of the Related Technology

Generally, a process of depositing a thin film on a substrate is used in manufacturing a semiconductor device or a flat panel display. In order to deposit a thin film having a predetermined thickness on the substrate, certain deposition methods such as a physical vapor deposition (PVD) using a physical collision of a particle or a chemical vapor deposition (CDV) using chemical reactions, etc., are frequently used.

SUMMARY

One inventive aspect is an atomic layer deposition apparatus which improves the injection efficiency and the exhaust efficiency of a gas by improving a structure of a gas injection nozzle arranged in a shower head of the atomic layer deposition apparatus.

Another aspect is a sealing method for sealing an organic light emitting device by using the atomic layer deposition apparatus.

Another aspect is a structure of a part of the purge gas injection nozzle in the atomic layer deposition apparatus to improve a deposition speed and a film quality in a deposition process.

Another aspect is an atomic layer deposition apparatus having an improved structure of a part of the purge gas injection nozzle.

Another aspect is an atomic layer deposition apparatus including: a reaction chamber; a substrate support installed at an inside of the reaction chamber to support the substrate; and a shower head including one or more nozzle sets, which can inject a first source gas, a second source gas, and a purge gas on the substrate, and being disposed above the substrate support.

Here, at least one of the substrate support and the shower head is installed in such a manner that it can move in a first direction. Further, each of the one or more nozzle sets includes a first part nozzle set for depositing the first source gas and a second part nozzle set for depositing the second source gas. The first part nozzle set includes a first source gas injection nozzle, a purge gas injection nozzle, and a purge gas exhaust hole, and the second part nozzle set includes a second source gas injection nozzle, a purge gas injection nozzle, and a purge gas exhaust hole.

Each of the first source gas injection nozzle, the second source gas injection nozzle, the purge gas injection nozzle, and the purge gas exhaust hole extends in a perpendicular direction to the first direction, and the purge gas injection nozzle has a slope inclined toward the purge gas exhaust hole.

In one embodiment, each of the first source gas injection nozzle, the second source gas injection nozzle, the purge gas injection nozzle, and the purge gas exhaust hole is formed in a slit shape extending in a perpendicular direction to the first direction. In this case, an end of the purge gas injection nozzle having the slit shape may have a slope.

In one embodiment, the slope formed at the purge gas injection nozzle has an inclination angle θ larger than about 0° and smaller than about 90° from a perpendicular direction to the first direction. A person skilled in the art can select a suitable inclination angle within the above range as necessary. For example, the inclination angle θ is in a range of about 15° to about 60° in consideration of an injection speed and an injection pressure of the purge gas.

In one embodiment, at least one of the first source gas injection nozzle and the second source gas injection nozzle has a slope inclined toward the purge gas injection nozzle. Here, the slope has an inclination angle θ larger than about 0° and smaller than about 90° from a perpendicular direction to the first direction. A person skilled in the art can select a suitable inclination angle within the above range as necessary. For example, the inclination angle θ is in a range of about 15° to about 60° in consideration of a source gas injection speed and a deposition speed.

According to an embodiment, a length of each of the first source gas injection nozzle, the second source gas injection nozzle, the purge gas injection nozzle, and the purge gas exhaust hole is longer than or identical to a width of the substrate perpendicular to the first direction.

In one embodiment, the shower head includes a plurality of nozzle sets sequentially arranged in the first direction.

In one embodiment, the shower head includes nozzle sets, the number of which may correspond to a thickness of a film to be deposited on the substrate.

In one embodiment, the shower head includes a first source gas supply line for supplying the first source gas to the first source gas injection nozzle, a second source gas supply line for supplying the second source gas to the second source gas injection nozzle, a purge gas supply line for supplying the purge gas to the purge gas injection nozzle arranged within the shower head.

In one embodiment, the first source gas supply line, the second source gas supply line, and the purge gas supply line are separated from each other.

In one embodiment, the first source gas supply line includes a first source gas main line connected to a first source gas storage tank located at an outside of the reaction chamber, and one or more first source gas branch lines branched from the first source gas main line to be connected to each of the first source gas injection nozzles, the second source gas supply line includes a second source gas main line connected to a second source gas storage tank located at an outside of the reaction chamber, and one or more second source gas branch lines branched from the second source gas main line to be connected to each of the second source gas injection nozzles. Further, the purge gas supply line includes a purge gas main line connected to a purge gas storage tank located at an outside of the reaction chamber, and one or more purge gas branch lines branched from the purge gas main line to be connected to each of the purge gas injection nozzles.

In one embodiment, the shower head is fixedly installed, and the substrate support is installed in such a manner that the substrate support can reciprocate in the first direction D. According to another embodiment, the substrate support is fixedly installed, and the shower head is installed in such a manner that the shower head can reciprocate in the first direction D.

Another aspect is a sealing method of an organic light emitting device by using the atomic layer deposition apparatus. The sealing method of an organic light emitting device includes: placing an organic light emitting device to be sealed on the substrate support of the atomic layer deposition apparatus; moving at least one of the substrate support and a shower head in a first direction; and depositing one or more first atomic layers and one or more second atomic layers on the organic light emitting device to be sealed by injecting a first source gas, a second source gas, and a purge gas through the shower head during moving of the at least one of the substrate support and a shower head in a first direction. Here, depositing of the one or more first atomic layers and the one or more second atomic layers includes: a first step of injecting the first source gas to deposit the first atomic layer on the organic light emitting device to be sealed; a second step of injecting the purge gas while the first step is processed or after the first step to remove a remaining first source gas; a third step of injecting the second source gas to deposit the second atomic layer on the first atomic layer; and a fourth step of injecting the purge gas while the third step is processed or after the third step to remove a remaining second source gas.

In one embodiment, depositing of the one or more first atomic layers and the one or more second atomic layers is processed from one end to another end of the organic light emitting device to be sealed.

In one embodiment, the first step to the fourth step are processed multiple times while moving of the at least one of the substrate support and a shower head in the first direction is processed one time.

In one embodiment, the sealing method further includes returning at least one of the organic light emitting device to be sealed and the shower head to an original position after depositing of the one or more first atomic layers and one or more second atomic layers.

In one embodiment, moving of the at least one of the substrate support and a shower head in a first direction, depositing of the one or more first atomic layers and the one or more second atomic layers, and returning of the at least one of the organic light emitting device to be sealed and the shower head to the original position are repeatedly performed. By the repeated performing, it is possible to obtain a deposited film having a required thickness.

In one embodiment, the shower head is fixed and the substrate on which the atomic layer deposition is placed moves in the first direction D while performing deposition.

Another aspect is a nozzle set for a deposition including: a first part nozzle set for depositing a first source gas and a second part nozzle set for depositing a second source gas, wherein the first part nozzle set includes a first source gas injection nozzle, a purge gas injection nozzle, and a purge gas exhaust hole, the second nozzle set includes a second source gas injection nozzle, a purge gas injection nozzle, and a purge gas exhaust hole, and the purge gas injection nozzle has a slope inclined toward the purge gas exhaust hole.

The first source gas injection nozzle, the second source gas injection nozzle, the purge gas injection nozzle, and the purge gas exhaust hole are formed in a slit shape extending in a perpendicular direction to the first direction. In this case, an end of the purge gas injection nozzle having the slit shape may have a slope.

In one embodiment, the slope formed at the purge gas injection nozzle has an inclination angle $\theta$ larger than about $0°$ and smaller than about $90°$ from a perpendicular direction to the first direction. A person skilled in the art can select a suitable inclination angle within the above range as necessary. For example, the inclination angle $\theta$ is in a range of about $15°$ to about $60°$ in consideration of an injection speed and an injection pressure of the purge gas.

In one embodiment, at least one of the first source gas injection nozzle and the second source gas injection nozzle has a slope inclined toward the purge gas injection nozzle. Here, the slope has an inclination angle $\theta$ larger than about $0°$ and smaller than about $90°$ from a perpendicular direction to the first direction. A person skilled in the art can select a suitable inclination angle within the above range as necessary. For example, the inclination angle $\theta$ is in a range of about $15°$ to about $60°$ in consideration of a source gas injection speed and a deposition speed.

The nozzle set for the deposition may be usefully applied to the atomic layer deposition.

Another aspect is an atomic layer deposition apparatus including: a reaction chamber; a substrate support installed at an inside of the reaction chamber to support the substrate; and a shower head including one or more nozzle sets, which can inject a source gas and a purge gas onto the substrate, and being disposed above the substrate support. In the atomic layer deposition apparatus, at least one of the substrate support and the shower head is installed in such a manner that it can move in a first direction D. Further, the nozzle sets include a source gas injection nozzle, a purge gas injection nozzle, and a purge gas exhaust hole, each of the source gas injection nozzle, the purge gas injection nozzle, and the purge gas exhaust hole extends in a perpendicular direction to the first direction, and the purge gas injection nozzle has a slope inclined toward the purge gas exhaust hole.

In one embodiment, the source gas injection nozzle, the purge gas injection nozzle, and the purge gas exhaust hole are formed in a slit shape extending in a perpendicular direction to the first direction. In this case, an end of the purge gas injection nozzle having the slit shape may have a slope.

According to an embodiment, the slope formed at the purge gas injection nozzle has an inclination angle $\theta$ larger than about $0°$ and smaller than about $90°$ from a perpendicular direction to the first direction. A person skilled in the art can select a suitable inclination angle within the above range as necessary. For example, the inclination angle $\theta$ is in a range of about $15°$ to about $60°$ in consideration of an injection speed and an injection pressure of the purge gas.

In one embodiment, the source gas injection nozzle also may have a slope inclined toward the purge gas injection nozzle. Here, the slope may have an inclination angle $\theta$ larger than about $0°$ and smaller than about $90°$ from a perpendicular direction to the first direction. For example, the inclination angle $\theta$ is in a range of about $15°$ to about $60°$ in consideration of a source gas injection speed and a deposition speed.

Another aspect is a sealing method of an organic light emitting device by using the atomic layer deposition apparatus. The sealing method of an organic light emitting device includes: placing an organic light emitting device to be sealed on the substrate support of the atomic layer deposition apparatus; moving at least one of the substrate support and the shower head of the atomic layer deposition apparatus in a first direction; depositing an atomic layer on the organic light emitting device to be sealed by injecting the source gas through the shower head during the moving of at least one of the substrate support and the shower head; and removing a remaining source gas by injecting the purge gas during depositing of the atomic layer on the organic light emitting device to be sealed.

Another aspect is a nozzle set for deposition including a source gas injection nozzle, a purge gas injection nozzle, and a purge gas exhaust hole. In the nozzle set, the source gas injection nozzle, the purge gas injection nozzle, and the purge gas exhaust hole are sequentially arranged, and the purge gas injection nozzle has a slope inclined toward the purge gas exhaust hole.

In one embodiment, the source gas injection nozzle, the purge gas injection nozzle, and the purge gas exhaust hole are formed in a slit shape extending in a perpendicular direction to the first direction. In this case, an end of the purge gas injection nozzle having the slit shape may have a slope.

In one embodiment, the slope formed at the purge gas injection nozzle has an inclination angle θ larger than about 0° and smaller than about 90° from a perpendicular direction to the first direction. A person skilled in the art can select a suitable inclination angle within the above range as necessary. For example, the inclination angle θ is in a range of about 15° to about 60° in consideration of an injection speed and an injection pressure of the purge gas.

In one embodiment, the source gas injection nozzle may have a slope inclined toward the purge gas injection nozzle. Here, the slope may have an inclination angle θ larger than about 0° and smaller than about 90° from a perpendicular direction to the first direction. For example, the inclination angle θ is more limited within a range of about 15° to about 60° in consideration of a source gas injection speed and a deposition speed of the source gas.

The nozzle set for the deposition may be usefully applied to the atomic layer deposition.

DETAILED DESCRIPTION

Recently, as the semiconductor device or a display device has a finer structure, a thin film having fine patterns is required. Accordingly, it is a current trend that the application of the atomic layer deposition (ALD) method, which can deposit fine patterns with a thickness of an atomic layer level very uniformly, is expanding.

The ALD method is performed by injecting one source gas into a process chamber so as to be physically adsorbed to a substrate, purging the remaining gas to remove it, and then injecting another gas into the process chamber. The ALD method is useful to prevent unnecessary chemical reaction of two different gases.

For example, in a process of depositing the atomic layer by using two kinds of source gases, a first source gas is injected into a reaction chamber to deposit an atomic layer on the substrate by the first source gas, a purge gas is injected into the reaction chamber to remove the first source gas, which has not been deposited, from the reaction chamber, a second source gas is injected into the reaction chamber to deposit the atomic layer by the second source gas, and then the purge gas is injected into the reaction chamber to remove the second source gas, which has not been deposited, from the reaction chamber, so that the atomic layer by the first source gas and the atomic layer by the second source gas are combined, which forms a thin film having a desired characteristic. As described above, in the atomic layer deposition method, the injection of the first source gas and the purging, and the injection of the second source gas and the purging forms one cycle. By repeating this cycle, a film having desired thickness and characteristic is formed on the substrate.

Meanwhile, an organic light emitting device is vulnerable to moisture and oxygen so that it is necessary to form a protective film or layer after manufacturing the organic light emitting device in order to prevent the damage caused by moisture and oxygen. Currently, a protective layer formed of glass is used, but it is required to develop a new sealing method for the sealing efficiency and the thinning.

A module-typed atomic layer deposition method may be applied for sealing the organic light emitting device. An atomic layer deposition apparatus has a structure shown in FIG. 1.

Figure 1:
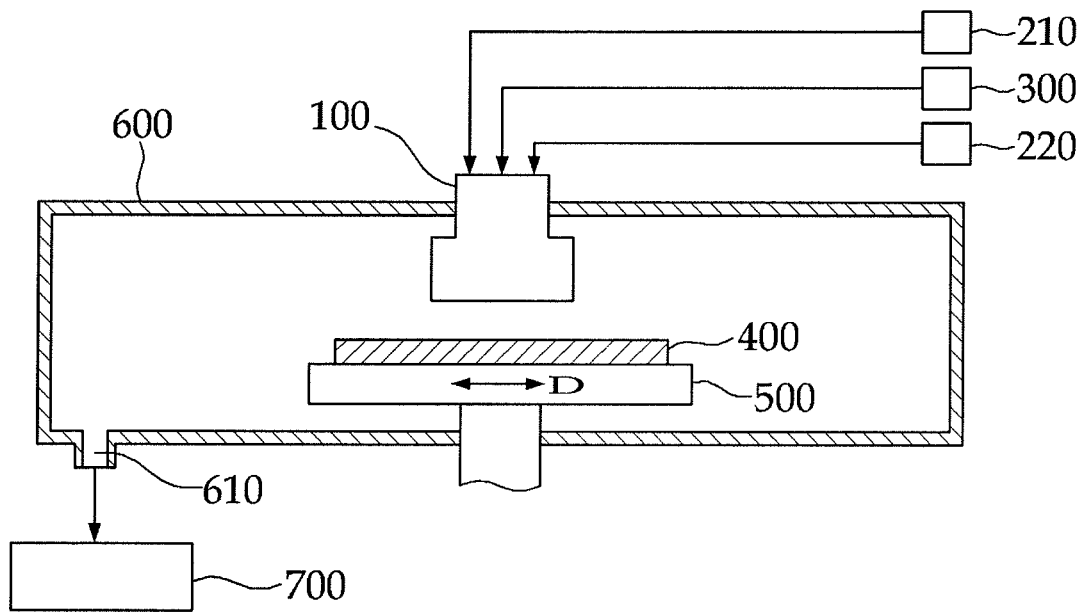
FIG. 1 illustrates an atomic layer deposition apparatus.

Referring to FIG. 1, the atomic layer deposition apparatus includes a reaction chamber 600, a substrate support 500 installed in the reaction chamber 600 to support a substrate 400, and a shower head 100 disposed above the substrate support 500 to inject a first source gas, a second source gas, and a purge gas onto the substrate 400. An inside of the reaction chamber 600 maintains a vacuum state.

The substrate support 500 is disposed at a lower part of an inside of the reaction chamber 600 to support the substrate 400, which will be processed. At least one of the substrate support 500 and the shower head 100 is installed in such a manner that it can reciprocate in a scanning direction. The shower head 100 includes one or more nozzle sets, which can simultaneously inject the first source gas, the second source gas, and the purge gas onto the substrate 400.

Figure 2:
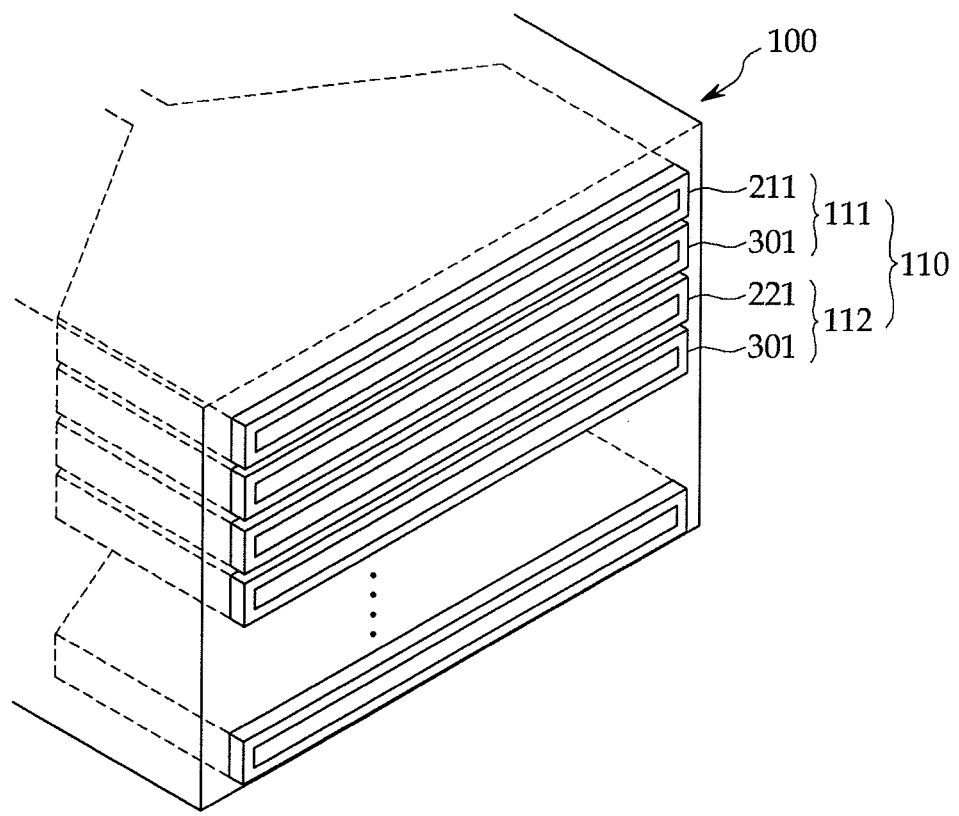
FIG. 2 is a perspective view schematically illustrating an example of a shower head of the atomic layer deposition apparatus and a nozzle set arranged in the shower head.

FIG. 2 illustrates an example of the nozzle set 110 arranged in the shower head. In FIG. 2, the nozzle set 110 includes four nozzles 211, 301, 221, and 301 extending in parallel to each other, in a perpendicular direction to a movement direction of the substrate support 500. The four nozzles are spaced apart from each other at a predetermined interval. A first source gas injection nozzle 211, a purge gas injection nozzle for removing the remaining first source gas 301, a second source gas injection nozzle 221, and a purge gas injection nozzle 301 for removing the remaining second source gas are sequentially arranged. Here, the first source gas injection nozzle 211, and the purge gas injection nozzle 301 for removing the remaining first source gas form a first part nozzle set 111, and the second source gas injection nozzle 221, and the purge gas injection nozzle 301 for removing the remaining second source gas form a second part nozzle set 112.

Figure 3:
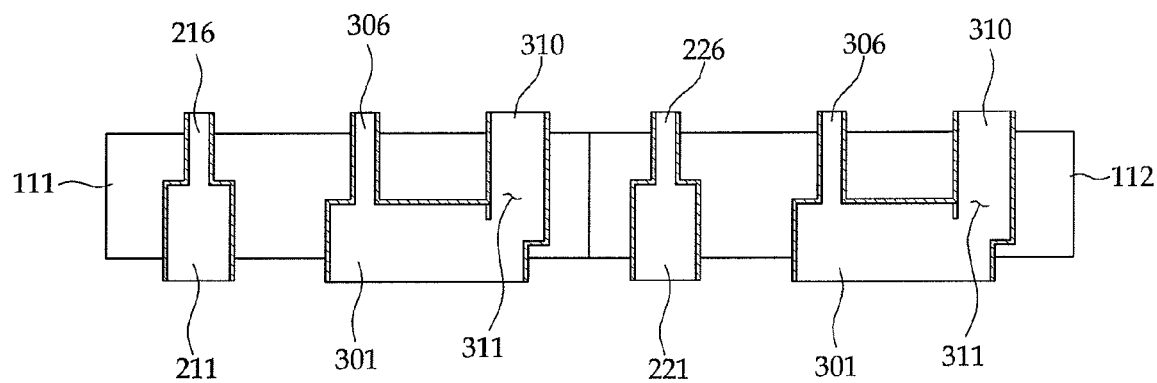
FIG. 3 is a cross-sectional view illustrating an example of the nozzle set inserted in the shower head of a module-typed atomic layer deposition apparatus.
Figure 4:
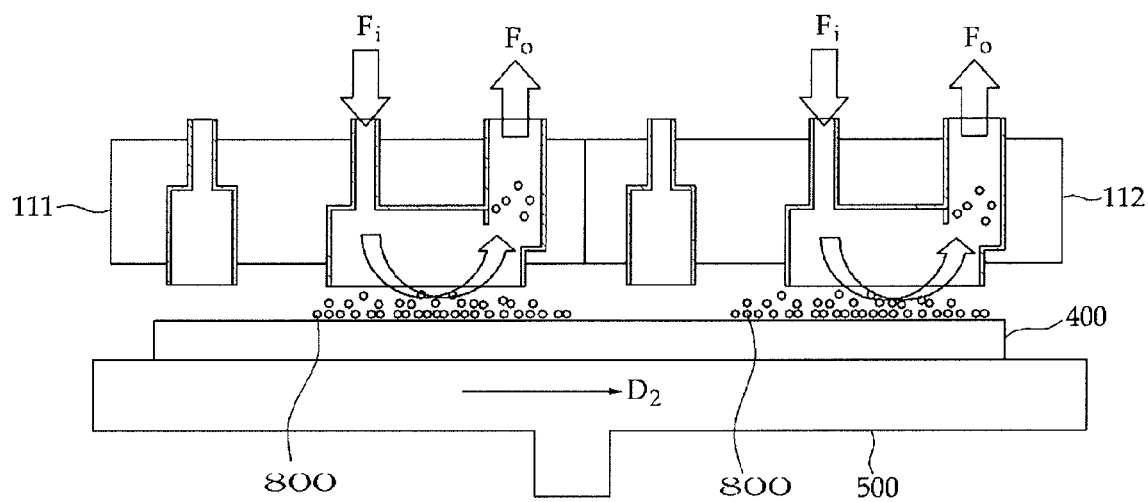
FIG. 4 is a view schematically illustrating that, in the nozzle set according to FIG. 3, a purge gas is injected into a substrate through a purge gas injection nozzle to remove the remaining source gas.

FIG. 3 is a cross-sectional view of another example of the nozzle set inserted in the shower head 100, wherein a purge gas exhaust hole 311 for exhausting a purge gas is illustrated. FIG. 4 schematically illustrates that the purge gas (Fi) is injected into the substrate through the purge gas injection nozzle 301 to remove the remaining source gas. Further, FIG. 4 also illustrates that the purge gas (Fo) is exhausted together with the remaining gas after the purge gas (Fi) is injected into the substrate through a purge gas branch line 306 and the purge gas injection nozzle 301.

In the atomic layer deposition, the first source gas supply, the purge gas supply, the second source gas supply, and the purge gas supply are sequentially processed. For the improvement of a deposition speed and a film quality, the purging time should be short and the remaining gas should be sufficiently removed by the purging. However, a lower part of the purge gas injection nozzle 301 is orthogonally formed as shown in FIGS. 3 and 4, so that a flow of the purge gas is not smooth. As a result, the purging efficiency is deteriorated as the purge gas partially swirls, which makes the purging time longer or the purging imperfect. When the purging is imperfect, a degradation of the film quality may occur due to the remaining source gas 800.

Hereinafter, embodiments will be described with reference to the accompanying drawings. In the following description and drawings, the same reference numerals are used to designate the same or similar components.

FIG. 1 is a cross-sectional view schematically illustrating a general atomic layer deposition apparatus. The atomic layer deposition apparatus according to an embodiment has a basic structure as shown in FIG. 1.

Referring to FIG. 1, the atomic layer deposition apparatus includes a reaction chamber 600, a substrate support 500 installed in the reaction chamber 600 to support a substrate 400, and a shower head 100 disposed above the substrate support 500 to inject a first source gas, a second source gas, and a purge gas onto the substrate 400.

An inside of the reaction chamber 600 maintains a vacuum state. For the vacuum state, an exhaust hole 610 is formed on a wall of the reaction chamber 600 and the exhaust hole 610 is connected to a vacuum pump 700. The exhaust hole 610 can be also used for exhausting the first source gas, the second source gas, and the purge gas.

The substrate support 500 is disposed at a lower part of an inside of the reaction chamber 600 to support the substrate 400, which will be processed. Although not illustrated in figures, the substrate support 500 may include a heating means for heating the substrate 400 to a predetermined temperature.

At least one of the substrate support 500 and the shower head 100 is installed in such a manner that it can reciprocate in a scanning direction. Specifically, at least one of the substrate support 500 and the shower head 100 is installed so that it can move in a first direction D indicated as an arrow.

Hereinafter, embodiments will be described based on a structure, in which the shower head 100 is fixedly installed and the substrate support 500 is installed in such a manner that the substrate support 500 can reciprocate in the first direction D.

According to an embodiment, a construction in which the substrate support 500 is fixed and the shower head 100 can move may be provided, or a construction in which both the substrate support 500 and the shower head 100 can move may be provided. However, in the following description, the structure in which only the substrate support 500 moves will be discussed for simplicity of the description.

Figure 5:
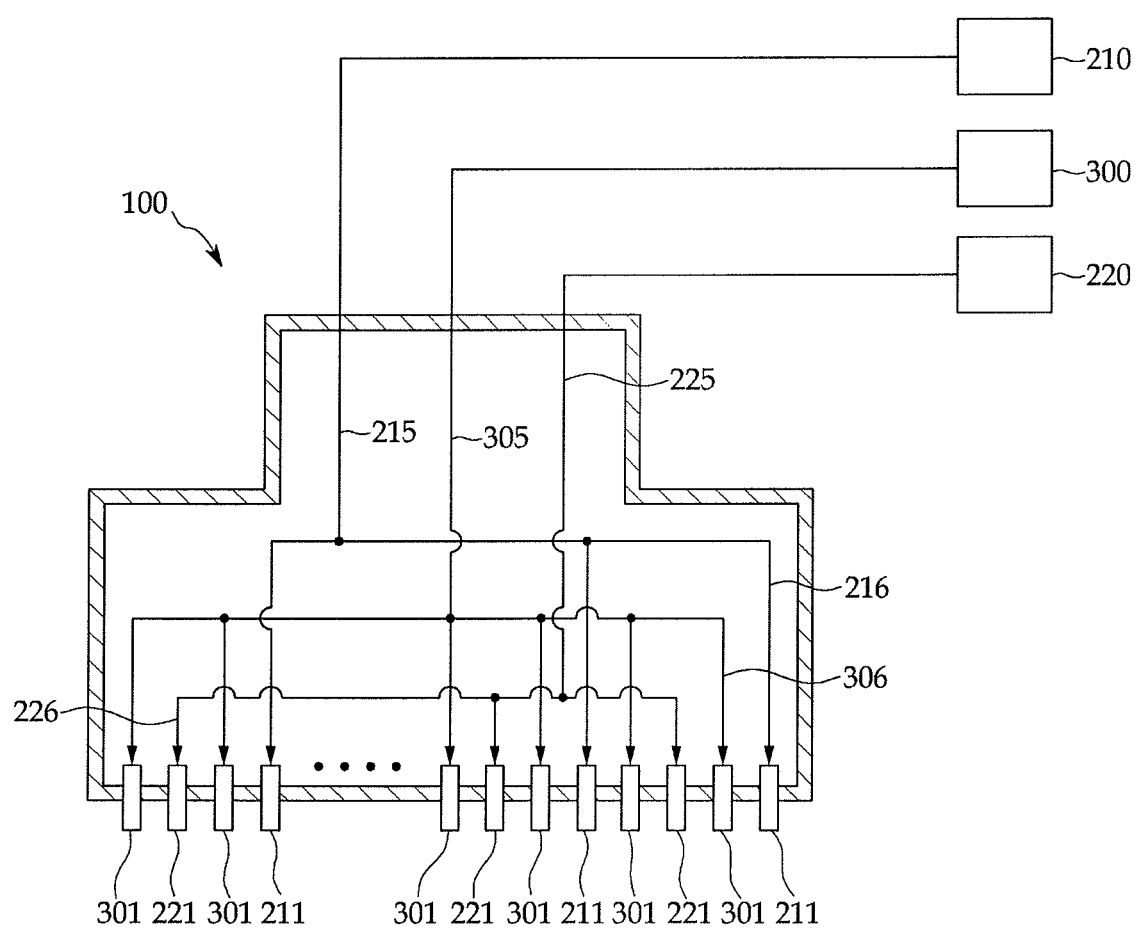
FIG. 5 is a view illustrating a nozzle set arranged in the shower head of the atomic layer deposition apparatus and gas supply lines connecting the nozzle set with gas tanks.
Figure 6:
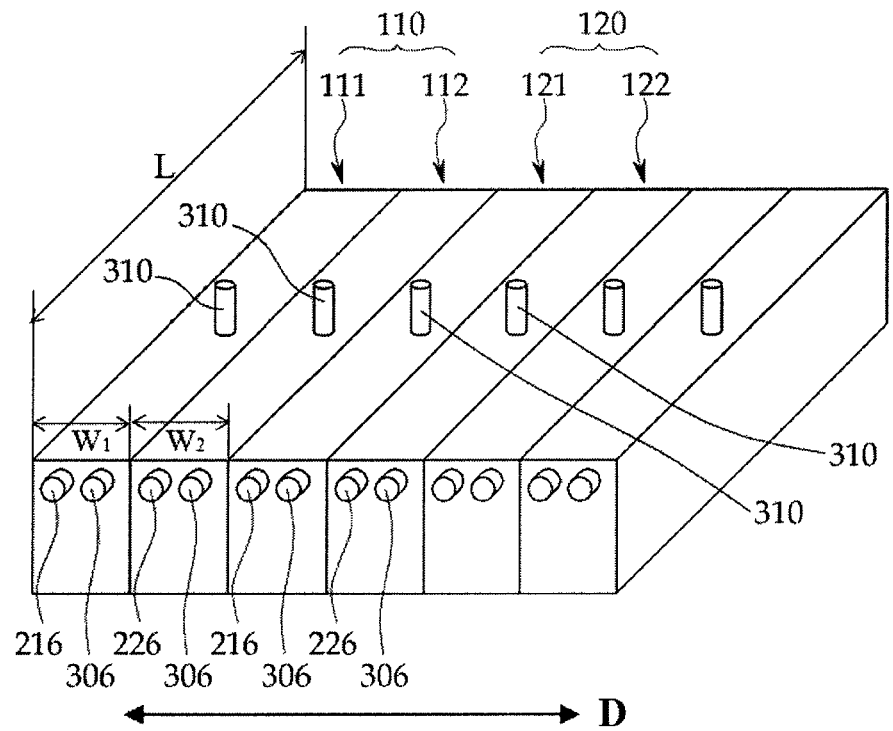
FIG. 6 is an external perspective view illustrating an example of a module-typed nozzle set inserted in the shower head of the atomic layer deposition apparatus.

FIG. 5 illustrates nozzle sets disposed in the shower head 100 of the atomic layer deposition apparatus and gas supply lines connecting the nozzle sets with gas tanks. Further, FIG. 6 illustrates an example of module typed-nozzle sets inserted in the shower head.

Specifically, the shower head 100 is disposed above the substrate support 500 and includes one or more nozzle sets (110, 120, etc.), which can inject a first source gas, a second source gas, and a purge gas onto the substrate 400.

Each of the one or more nozzle sets 110 and 120 includes a first part nozzle set 111 for depositing the first source gas and a second part nozzle set 112 for depositing the second source gas. Here, a first source gas injection nozzle 211 and a purge gas injection nozzle 301 for removing the remaining first source gas are disposed in the first part nozzle set 111, and a second source gas injection nozzle 221 and a purge gas injection nozzle 301 for removing the remaining second source gas are disposed in the second part nozzle set 112.

Specifically, the first part nozzle set 111 includes the first source gas injection nozzle 211, the purge gas injection nozzle 301, and a purge gas exhaust hole 311, and the second part nozzle set 112 includes the second source gas injection nozzle 221, the purge gas injection nozzle 301, and a purge gas exhaust hole 311.

Referring to FIGS. 5 and 6, the shower head may include a plurality of nozzle sets (110, 120, etc.) sequentially arranged in the first direction D. That is, the number of the nozzle sets may be one or more as necessary.

The shower head may include the number of nozzle sets corresponding to a thickness of a deposition film, which will be deposited on the substrate. Accordingly, when the thickness of the film to be deposited is thick, the number of nozzle sets increases. However, a thick film does not always require a large number of nozzle sets. When the film to be deposited is thick, the deposition may be repeated while reciprocating the substrate support 500 as many times as necessary.

Referring to FIG. 5, a first source gas supply line for supplying the first source gas to the first source gas injection nozzle, a second source gas supply line for supplying the second source gas to the second source gas injection nozzle, and a purge gas supply line for supplying the purge gas to the purge gas injection nozzle are arranged within the shower head.

The first source gas supply line, the second source gas supply line, and the purge gas supply line are separated from each other.

Specifically, the first source gas supply line includes a first source gas main line 215 connected to a first source gas storage tank 210, and one or more first source gas branch lines 216 branched from the first source gas main line 215 to be connected to each of the first source gas injection nozzles 211.

Further, the second source gas supply line includes a second source gas main line 225 connected to a second source gas storage tank 220, and one or more second source gas branch lines 226 branched from the second source gas main line 225 to be connected to each of the second source gas injection nozzles 221.

Further, the purge gas supply line includes a purge gas main line 305 connected to a purge gas storage tank 300, and one or more purge gas branch lines 306 branched from the purge gas main line 305 to be connected to each of the purge gas injection nozzles 301.

A purge gas exhaust line is not illustrated in FIG. 5.

Referring to FIG. 6, the purge gas can be exhausted to an outside of the nozzle sets through purge gas exhaust nozzles 310 arranged in the nozzle sets. Here, the purge gas exhaust nozzle 310 is connected to a purge gas exhaust hole 311. The purge gas exhausted to the outside of the nozzle set through the purge gas exhaust nozzle 310 can be exhausted to an outside of the reaction chamber 600 by the vacuum pump 700 installed at the outside of the reaction chamber 600.

Referring to FIG. 6, the first source gas branch line 216, the second source gas branch line 226, and the purge gas branch line 306 are connected at an inside of the nozzle set through a front side of the nozzle set, and the purge gas exhaust nozzle 310 is connected to the outside of the nozzle set through an upper part of the nozzle set.

Figure 7:
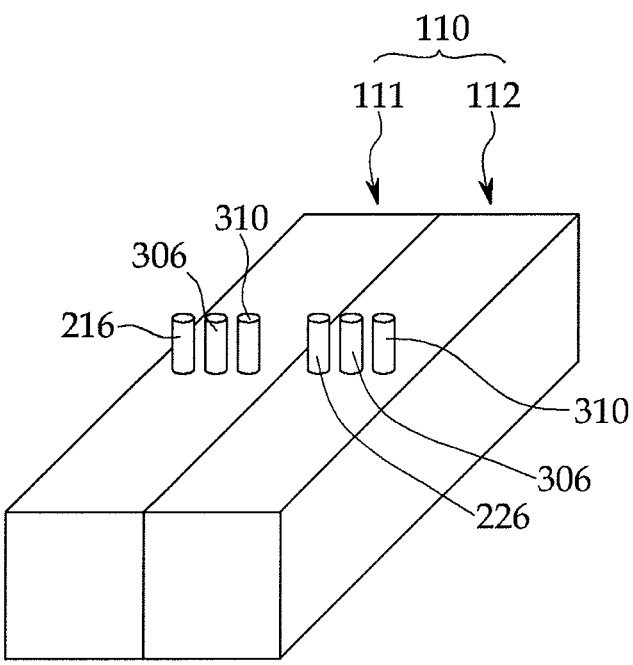
FIG. 7 is an external perspective view illustrating another example of the module-typed nozzle set inserted in the shower head of the atomic layer deposition apparatus.

FIG. 7 illustrates another example of the module typed-nozzle set. Here, the first source gas branch line 216, the second source gas branch line 226, and the purge gas branch line 306 are connected to the inside of the nozzle set through the upper part of the nozzle set, and the purge gas exhaust nozzle 310 is also connected to the outside of the nozzle set through the upper part of the nozzle set.

Figure 8:
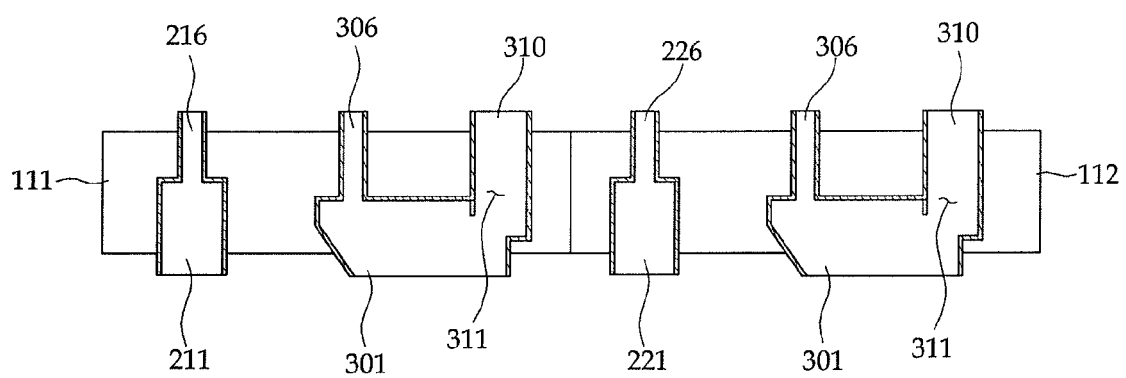
FIG. 8 is a cross-sectional view schematically illustrating an example of a nozzle set applied to the atomic layer deposition apparatus according to an embodiment.
Figure 9:
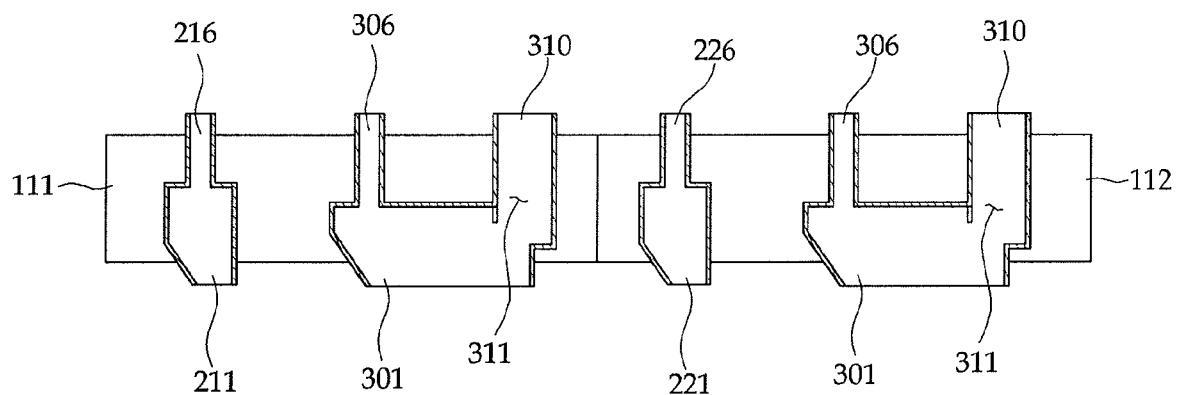
FIG. 9 is a cross-sectional view schematically illustrating another example of a nozzle set applied to the atomic layer deposition apparatus according to an embodiment.
Figure 10:
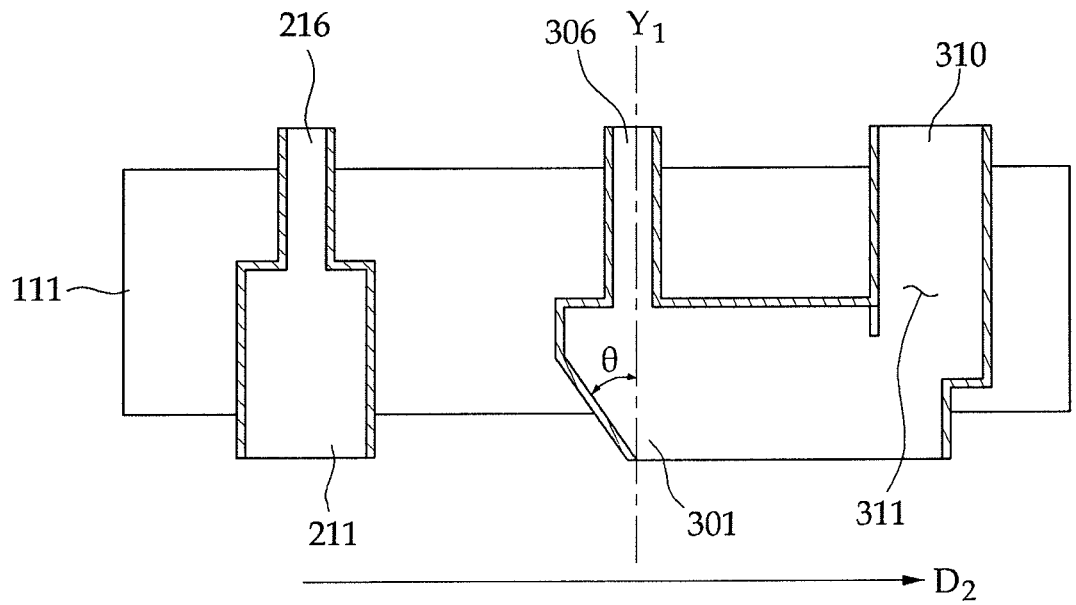
FIG. 10 is a cross-sectional view schematically illustrating another example of a nozzle set applied to the atomic layer deposition apparatus according to an embodiment.

Referring to FIGS. 8 to 10, each of the first source gas injection nozzle 211, the second source gas injection nozzle 221, the purge gas injection nozzle 301, and the purge gas exhaust hole 311 extends in a perpendicular direction Y1 to the first directions D and D2. FIGS. 8, 9, and 10 illustrate an example of the first source gas injection nozzle 211, the second source gas injection nozzle 221, the purge gas injection nozzle 301, and the purge gas exhaust hole 311, each of which has a slit shape.

FIGS. 8 and 9 are cross-sectional views cutting the nozzle set 110 shown in FIG. 7 along a width direction. Here, the first nozzle set 111 and the second nozzle set 112 are separated from each other.

Referring to FIG. 6, a length L direction corresponds to a perpendicular direction to the first direction D, and width W1 and W2 direction corresponds to a parallel direction to the first direction D. L represents a length of the nozzle set, W1 represents a width of the first nozzle set 111, and W2 represents a width of the second nozzle set 112.

Likewise, a lengthwise direction of each of the first source gas injection nozzle 211, the second source gas injection nozzle 221, and the purge gas injection nozzle 301 of the nozzle sets 110 and 120 is perpendicular to the movement direction D, and is the same as the length L direction of the nozzle set. A widthwise direction of each of the first source gas injection nozzle 211, the second source gas injection nozzle 221, and the purge gas injection nozzle 301 included in the nozzle sets 110 and 120 is parallel to the first direction D, and the same with the width direction of the nozzle set.

A length of each of the first source gas injection nozzle 211, the second source gas injection nozzle 221, and the purge gas injection nozzle 301 is the same as or lower than the length of the nozzle set, and a width of each of the first source gas injection nozzle 211, the second source gas injection nozzle 221, and the purge gas injection nozzle 301 is the same as or lower than the width of the nozzle set.

The substrate 400 is disposed on the substrate support 500. The substrate 400 can move in the first direction D, and more specifically, the substrate 400 can move in a left direction D1 or a right direction D2.

The substrate moves in the first direction D which is a lengthwise direction of the substrate 400 so that the substrate 400 is continuously deposited in the lengthwise direction. A widthwise direction of the substrate is perpendicular to the first direction D and corresponds to the lengthwise direction L of the nozzle set.

According to an embodiment, the length of each of the first source gas injection nozzle 211, the second source gas injection nozzle 221, the purge gas injection nozzle 301, and the purge gas exhaust hole 311 may be longer than or the same as the width of the substrate which is perpendicular to the first direction.

Referring to FIGS. 8 and 9, the first source gas injection nozzle 211, the second source gas injection nozzle 221, the purge gas injection nozzle 301, and the purge gas exhaust hole 311 of the nozzle sets 110 and 120 have slit shapes extending in parallel, in a perpendicular direction to the movement direction D of the substrate support 500, and are spaced apart from each other at a predetermined interval. The slit shape may be easily understood with reference to FIG. 2. However, structures of the nozzles according to embodiment are not always the same as that shown in FIG. 2.

In the nozzle set applied to the atomic layer deposition apparatus according to embodiment, the purge gas injection nozzle 301 has a slope inclined toward the purge gas exhaust hole 311 as shown in FIG. 8. Particularly, FIG. 8 illustrates the slope formed at an end of the purge gas injection nozzle 301.

A typical purge gas injection nozzle is formed only in a direction perpendicular to the first direction so that a flow of the purge gas when the purge gas is exhausted after the purge gas has been injected into the substrate is not smooth. Therefore, the purge gas partially swirls, which makes the purging efficiency deteriorated (Refer to FIG. 4).

The purge gas injection nozzle 301 according to embodiment has a slope inclined toward the purge gas exhaust hole 311. In this case, the purge gas is injected onto the substrate in a diagonal direction so that a flow of the purge gas is smooth and particularly, the purge gas smoothly moves to the purge gas exhaust hole, which makes the exhaust efficiency of the purge gas excellent. As the exhaust efficiency of the purge gas improves as described above, a purging time is shortened and it is possible to prevent the source gas from remaining. Accordingly, a total process time is shortened and a quality of the deposited film becomes excellent.

The slope formed at the purge gas injection nozzle has an inclination angle θ larger than about 0° and smaller than about 90° from the direction (Y1 direction in FIG. 10) perpendicular to the first direction D. A person skilled in the art can select a suitable inclination angle within the above range as necessary. For example, in consideration of an injection speed and an injection pressure of the purge gas, a range of the inclination angle θ may be more limited within about 15° to about 60°. After the purge gas is injected into the substrate within the range of the inclination angle, the purge gas is smoothly exhausted through the exhaust hole.

According to an embodiment, at least one of the first source gas injection nozzle 211 and the second source gas injection nozzle 221 has a slope inclined toward the purge gas injection nozzle 301. FIGS. 8 and 9 illustrate the first source gas injection nozzle 211 and the second source gas injection nozzle 221, each of which has a slit shape. In this case, the slope may be formed at an end of the slit.

The slope may have an inclination angle θ larger than about 0° and smaller than about 90° from the direction (Y1 direction) perpendicular to the first direction D. Of course, a range of the inclination angle θ may be more limited within about 15° to about 60°.

FIG. 9 illustrates an example of the first source gas injection nozzle 211 and the second source gas injection nozzle 221, which both have slopes.

At least one of the disclosed embodiments provides a sealing method for sealing an organic light emitting device by using the aforementioned atomic layer deposition apparatus.

Figure 11:
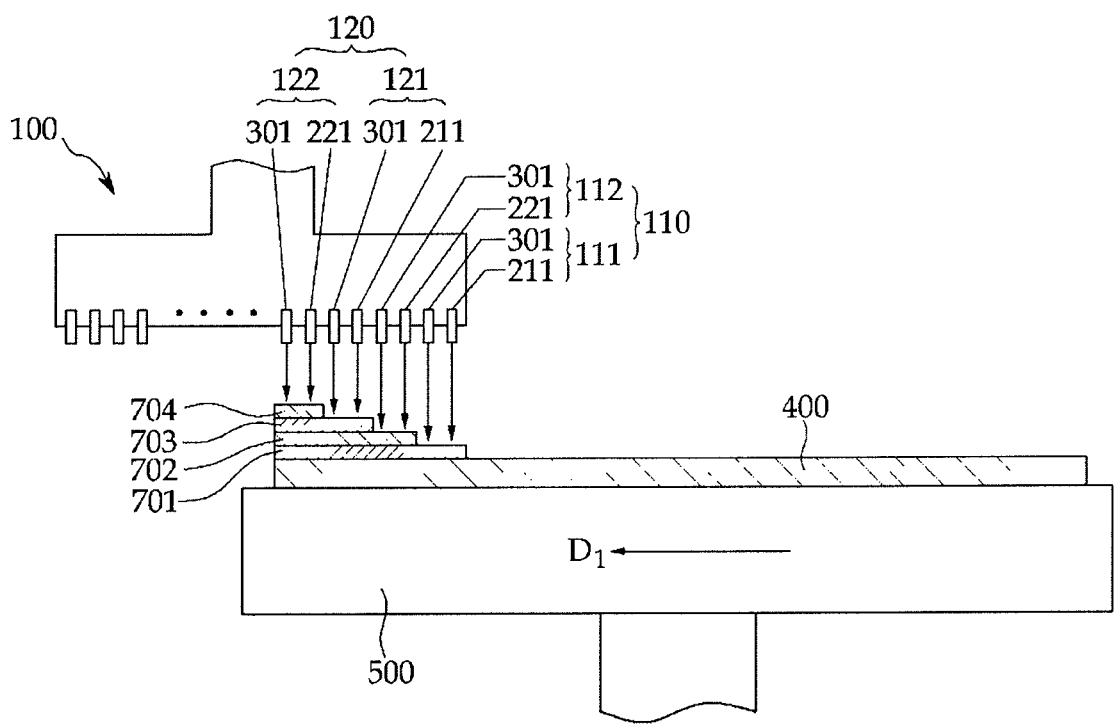
FIG. 11 illustrates a process of forming a film on the substrate by using the atomic layer deposition apparatus according to an embodiment while moving the substrate in one direction.

FIG. 11 illustrates a process of forming a film on the substrate while moving the substrate 400 in one direction D1 by using the aforementioned atomic layer deposition apparatus. Here, the organic light emitting device to be sealed corresponds to the substrate 400.

The sealing method of the organic light emitting device according to embodiment includes a step of placing the organic light emitting device to be sealed on the substrate support 500 of the atomic layer deposition apparatus; a movement step of moving at least one of the substrate support 500 and the shower head 100 of the atomic layer deposition apparatus in the first direction; and a deposition step of depositing one or more first atomic layers 701 and one or more second atomic layers 702 on the organic light emitting device to be sealed by injecting the first source gas, the second source gas, and the purge gas through the shower head 100 during the step of moving at least one of the substrate support 500 and the shower head 100.

The first atomic layer 701 and the second atomic layer 702 deposited as described above react with each other to form a film having desired thickness and characteristic.

According to an embodiment, the depositing of the film is performed while the organic light emitting device to be sealed is moved so that the depositing of the film is processed from one end to another end of the organic light emitting device to be sealed. In the movement step, for example, the substrate support 500 for supporting the organic light emitting device to be sealed, which is the substrate 400, can be moved in the left direction D1 of the first direction as described above.

The deposition step includes the following steps 1 to 4. First, the first source gas is injected through the first source gas injection nozzle 211 arranged in the first nozzle set 110 of the shower head 100 to deposit the first atomic layer 701 on the organic light emitting device to be sealed while the organic light emitting device to be sealed is moved in the first direction D1 (step 1).

Next, the purge gas is injected through the purge gas injection nozzle 301 arranged in the first nozzle set 110 to remove the remaining first source gas while step 1 is processed (step 2).

Then, the second source gas is injected through the second source gas injection nozzle 221 arranged in the first nozzle set 110 to deposit the second atomic layer 702 on the first atomic layer 701 while step 1 and step 2 are processed (step 3).

And then, the purge gas is injected through the purge gas injection nozzle 301 arranged in the first nozzle set 110 to remove the remaining second source gas while step 1, step 2, and step 3 are processed (step 4).

The shower head 100 may include only one nozzle set 110. In this case, when the deposition step including steps 1 to 4 is completed, a thin film including one first atomic layer 701 and one second atomic layer 702 may be formed on the organic light emitting device to be sealed.

As described above, the organic light emitting device can be sealed and encapsulated by using the atomic layer deposition method according to embodiments.

Meanwhile, after the deposition step, a return step of returning at least one of the substrate support 500 and the shower head 100, for example, returning the substrate support 500 on which the organic light emitting device to be sealed is disposed to the original position is performed. And then the movement step and the deposition step can be performed again. That is, the movement step, the deposition step, and the return step can be repeatedly performed. In this case, it is possible to form a thicker film.

Further, the shower head 100 may include a plurality of nozzle sets (110, 120, etc.) as can be seen in FIG. 6. In this case, while the movement step of the organic light emitting device to be sealed is performed one time, that is, while the organic light emitting device to be sealed moves in the first direction D one time, the deposition step including steps 1 to 4 can be successively performed several times.

Specifically, as described above, the gases are injected through the nozzles 211, 301, and 221 of the first nozzle set 110 to deposit the first atomic layer 701 and the second atomic layer 702 on the organic light emitting device to be sealed.

Subsequently, the gases are injected through the nozzles 211, 301, and 221 of the second nozzle set 120 to deposit a first atomic layer 703 on the second atomic layer 702 and a second atomic layer 704 on the first atomic layer 703 again. The depositions of the first atomic layer 701 and the second atomic layer 702 by the first nozzle set 110, and the depositions of the first atomic layer 703 and second atomic layer 704 by the second nozzle set 120 can be performed at the same time.

Of course, the depositions of the first atomic layer and the second atomic layer can be continuously performed by using nozzle sets additionally equipped.

As described above, it is possible to deposit a film having a thick thickness by alternately depositing a plurality of first atomic layers and a plurality of second atomic layers on the organic light emitting device to be sealed.

In this case also, after the deposition step, the return step of returning the substrate support 500, on which the organic light emitting device to be sealed is disposed, to the original position is performed. And then the movement step and the deposition step can be performed again. That is, it is possible to form a thicker film by repeatedly performing the movement step, the deposition step, and the returning step. When the atomic layer deposition method according to embodiment is applied to a sealing process of the organic light emitting device, it is possible to form a sealing film having a thickness of thousands of Å.

At least one embodiment also provides a nozzle set for the deposition.

As shown in FIG. 8, the nozzle set according to embodiment includes the first part nozzle set 111 for depositing the first source gas and the second part nozzle set 112 for depositing the second source gas, wherein the first part nozzle set includes the first source gas injection nozzle 211, the purge gas injection nozzle 301, and the purge gas exhaust hole 311, and the second part nozzle set 112 includes the second source gas injection nozzle 221, the purge gas injection nozzle 301, and the purge gas exhaust hole 311. Here, the purge gas injection nozzle 301 has a slope inclined toward the purge gas exhaust hole 311. In FIG. 8, particularly, the first source gas injection nozzle 211, the second source gas injection nozzle 221, the purge gas injection nozzle 301, and the purge gas exhaust hole 311 have a slit shape, and an end of the purge gas injection nozzle 301 has a slope.

According to an embodiment, the slope formed at the purge gas injection nozzle may have an inclination angle θ larger than about 0° and smaller than about 90° from a perpendicular direction (Y1 direction) to the first direction D. In consideration of an injection speed and an injection pressure of the purge gas, a range of the inclination angle θ may be more limited within about 15° to about 60°.

According to an embodiment, at least one of the first source gas injection nozzle 211 and the second source gas injection nozzle 221 may have a slope inclined toward the purge gas injection nozzle 301. FIG. 9 illustrates the nozzle set including the first source gas injection nozzle 211 and the second source gas injection nozzle 221, which both have the slopes. In this case, the incline may have an inclination angle θ larger than about 0° and smaller than about 90° from a perpendicular direction (Y1 direction) to the first direction D. Meanwhile, in consideration of an injection speed, an injection pressure, etc. of the source gas, a range of the inclination angle θ may be more limited within about 15° to about 60°.

At least one embodiment provides an atomic layer deposition apparatus including a single nozzle set as shown in FIG. 10. The atomic layer deposition apparatus includes the reaction chamber 600; the substrate support 500 installed at an inside of the reaction chamber to support the substrate 400; and the shower head 100 including one or more nozzle sets 111 disposed above an upper side of the substrate support to inject the source gas and the purge gas on the substrate. In the atomic layer deposition apparatus, at least one of the substrate support and the shower head is installed in such a manner that it can move in the first direction D, each of the one or more nozzle sets 111 includes the source gas injection nozzle 211, the purge gas injection nozzle 301, and the purge gas exhaust hole 311, each of the source gas injection nozzle 211, and the purge gas injection nozzle 301, and the to purge gas exhaust hole 311 extend in a perpendicular direction to the first direction, wherein the purge gas injection nozzle 301 has a slope inclined toward the purge gas exhaust hole 311.

FIG. 10 illustrates the source gas injection nozzle 211, the purge gas injection nozzle 301, and the purge gas exhaust hole 311, which have a slit shape. In this case, ends of the nozzles may have slopes.

Here, the slope formed at the purge gas injection nozzle may have an inclination angle θ larger than about 0° and smaller than about 90° from a direction (Y1 direction in FIG. 10) perpendicular to the first direction D. In consideration of an injection speed, an injection pressure, etc. of the purge gas, a range of the inclination angle θ may be more limited within about 15° to about 60°.

According to an embodiment, the source gas injection nozzle 211 may have the slope inclined toward the purge gas injection nozzle 301. Here, the slope may have an inclination angle θ larger than about 0° and smaller than about 90° from a perpendicular direction to the first direction D. In consideration of an injection speed, an injection pressure, etc. of the source gas, a range of the inclination angle θ may be more limited within about 15° to about 60°.

At least one embodiment provides a sealing method of the organic light emitting device for encapsulating the organic light emitting device by using the atomic layer deposition apparatus. The sealing method of the organic light emitting device according to an embodiment includes a step of placing the organic light emitting device to be sealed on the substrate support 500 of the atomic layer deposition apparatus; a movement step of moving at least one of the substrate support 500 and the shower head of the atomic layer deposition apparatus in the first direction; a deposition step of depositing the atomic layer on the organic light emitting device to be sealed by injecting the source gas through the shower head while the movement step is processed; and a purge step of removing the remaining source gas by injecting the purge gas while the deposition step is processed.

As shown in FIG. 10, one embodiment provides a nozzle set for the deposition including the source gas injection nozzle 211, the purge gas injection nozzle 301, and the purge gas exhaust hole 311 sequentially arranged, wherein the purge gas injection nozzle 301 has a slope inclined toward the purge gas exhaust hole 311.

Here, the slope formed at the purge gas injection nozzle may have an inclination angle θ larger than about 0° and smaller than about 90° from a perpendicular direction (Y1 direction in FIG. 10) to the first direction D. A person skilled in the art can select a suitable inclination angle within the range as necessary. For example, in consideration of an injection speed, an injection pressure, etc. of the purge gas, the range of the inclination angle θ may be more limited within about 15° to about 60°.

According to an embodiment, the source gas injection nozzle 211 may have the slope inclined toward the purge gas injection nozzle 301. In this case, the slope may have an inclination angle θ larger than about 0° and smaller than about 90° from a perpendicular direction to the first direction D. In some cases, a range of the inclination angle θ may be more limited within about 15° to about 60°.

The atomic layer deposition apparatus according to an embodiment improves a structure of a part of the purge gas injection nozzle to increase the exhaust efficiency of the purge gas in an atomic layer deposition process so that a speed of a purge process can be increased. As a result, when the atomic layer deposition apparatus is used according to an embodiment, the deposition speed and the film quality can be improved.

Although embodiments have been described with respect to the accompanying drawings, those skilled in the art will appreciate that various modifications, additions and substitutions are possible, without departing from the scope and spirit of the accompanying claims.

What is claimed is:

1. An atomic layer deposition apparatus comprising:
    a reaction chamber;
    a substrate support installed at an inside of the reaction chamber to support a substrate; and
    a shower head including one or more nozzle sets configured to inject first and second source gases and a purge gas onto the substrate, wherein the shower head is disposed above the substrate support,
    wherein at least one of the substrate support and the shower head is installed so as to move in a first direction,
    wherein each of the one or more nozzle sets includes a first part nozzle set configured to deposit the first source gas and a second part nozzle set configured to deposit the second source gas,
    wherein the first part nozzle set includes a first source gas injection nozzle, a purge gas injection nozzle, and a purge gas exhaust hole,
    wherein the second part nozzle set includes a second source gas injection nozzle, a purge gas injection nozzle, and a purge gas exhaust hole, and
    wherein each of the first and second source gas injection nozzles, the purge gas injection nozzle, and the purge gas exhaust hole extends in a substantially perpendicular direction to the first direction, and wherein the purge gas injection nozzle has a slope inclined toward the purge gas exhaust hole.

2. The atomic layer deposition apparatus as claimed in claim 1, wherein the slope formed at the purge gas injection nozzle has an inclination angle θ larger than about 0° and smaller than about 90° with respect to a substantially perpendicular direction to the first direction.

3. The atomic layer deposition apparatus as claimed in claim 2, wherein the inclination angle θ is in the range of about 15° to about 60°.

4. The atomic layer deposition apparatus as claimed in claim 1, wherein at least one of the first and second source gas injection nozzles has a slope inclined toward the purge gas injection nozzle.

5. The atomic layer deposition apparatus as claimed in claim 4, wherein the slope has an inclination angle θ larger than about 0° and smaller than about 90° with respect to a substantially perpendicular direction to the first direction.

6. The atomic layer deposition apparatus as claimed in claim 5, wherein the inclination angle θ is in the range of about 15° to about 60°.

7. The atomic layer deposition apparatus as claimed in claim 1, wherein the length of each of the first and second source gas injection nozzles, the purge gas injection nozzle, and the purge gas exhaust hole is longer than or substantially identical to the width of the substrate which is substantially perpendicular to the first direction.

8. The atomic layer deposition apparatus as claimed in claim 1, wherein the shower head includes a plurality of nozzle sets substantially sequentially arranged in the first direction.

9. The atomic layer deposition apparatus as claimed in claim 8, wherein the shower head includes nozzle sets, the number of which corresponds to the thickness of a film to be deposited on the substrate.

10. The atomic layer deposition apparatus as claimed in claim 1, wherein the shower head includes i) a first source gas supply line configured to supply the first source gas to the first source gas injection nozzle, ii) a second source gas supply line configured to supply the second source gas to the second source gas injection nozzle and iii) a purge gas supply line configured to supply the purge gas to the purge gas injection nozzle arranged within the shower head.

11. The atomic layer deposition apparatus as claimed in claim 10, wherein the first and second source gas supply lines and the purge gas supply line are separated from each other.

12. The atomic layer deposition apparatus as claimed in claim 10, wherein the first source gas supply line includes a first source gas main line connected to a first source gas storage tank located at an outside of the reaction chamber, wherein one or more first source gas branch lines are branched from the first source gas main line to be connected to each of the first source gas injection nozzles, wherein the second source gas supply line includes a second source gas main line connected to a second source gas storage tank located at an outside of the reaction chamber, wherein one or more second source gas branch lines are branched from the second source gas main line to be connected to each of the second source gas injection nozzles, wherein the purge gas supply line includes a purge gas main line connected to a purge gas storage tank located at an outside of the reaction chamber, and wherein one or more purge gas branch lines are branched from the purge gas main line to be connected to each of the purge gas injection nozzles.

13. The atomic layer deposition apparatus as claimed in claim 1, wherein the shower head is fixedly installed, and wherein the substrate support is installed so as to move in the first direction.

14. A nozzle set for a deposition comprising:
a first part nozzle set configured to deposit a first source gas; and
a second part nozzle set configured to deposit a second source gas,
wherein the first part nozzle set includes a first source gas injection nozzle, a purge gas injection nozzle, and a purge gas exhaust hole,
wherein the second nozzle set includes a second source gas injection nozzle, a purge gas injection nozzle, and a purge gas exhaust hole, and
wherein the purge gas injection nozzle has a slope inclined toward the purge gas exhaust hole.

15. The nozzle set as claimed in claim 14, wherein the slope formed at the purge gas injection nozzle has an inclination angle θ larger than about 0° and smaller than about 90° with respect to a substantially perpendicular direction to the first direction.

16. The nozzle set as claimed in claim 15, wherein the inclination angle θ is in the range of about 15° to about 60°.

17. The nozzle set as claimed in claim 14, wherein at least one of the first and second source gas injection nozzles has a slope inclined toward the purge gas injection nozzle.

18. The nozzle set as claimed in claim 17, wherein the slope has an inclination angle θ larger than about 0° and smaller than about 90° with respect to a substantially perpendicular direction to the first direction.

19. The nozzle set as claimed in claim 18, wherein the inclination angle θ is in the range of about 15° to about 60°.

20. An atomic layer deposition apparatus comprising:
a reaction chamber;
a substrate support installed at an inside of the reaction chamber to support the substrate; and
a shower head including one or more nozzle sets configured to inject a source gas and a purge gas onto the substrate, wherein the shower head is disposed above the substrate support,
wherein at least one of the substrate support and the shower head is installed so as to move in a first direction,
wherein the nozzle sets include a source gas injection nozzle, a purge gas injection nozzle, and a purge gas exhaust hole,
wherein each of the source gas injection nozzle, the purge gas injection nozzle, and the purge gas exhaust hole extends in a substantially perpendicular direction to the first direction, and
wherein the purge gas injection nozzle has a slope inclined toward the purge gas exhaust hole.

21. The atomic layer deposition apparatus as claimed in claim 20, wherein the slope formed at the purge gas injection nozzle has an inclination angle θ larger than about 0° and smaller than about 90° with respect to a substantially perpendicular direction to the first direction.

22. The atomic layer deposition apparatus as claimed in claim 21, wherein the inclination angle θ is in the range of about 15° to about 60°.

23. The atomic layer deposition apparatus as claimed in claim 20, wherein the source gas injection nozzle has a slope inclined toward the purge gas injection nozzle.

24. The atomic layer deposition apparatus as claimed in claim 23, wherein the slope has an inclination angle θ larger than about 0° and smaller than about 90° with respect to a substantially perpendicular direction to the first direction.

25. The atomic layer deposition apparatus as claimed in claim 24, wherein the inclination angle θ is in a range of about 15° to about 60°.

26. A nozzle set for deposition, comprising:
a source gas injection nozzle, a purge gas injection nozzle, and a purge gas exhaust hole,
wherein the source gas injection nozzle, the purge gas injection nozzle, and the purge gas exhaust hole are substantially sequentially arranged, and
wherein the purge gas injection nozzle has a slope inclined toward the purge gas exhaust hole.

27. The nozzle set as claimed in claim 26, wherein the slope formed at the purge gas injection nozzle has an inclination angle θ larger than about 0° and smaller than about 90° with respect to a substantially perpendicular direction.

28. The nozzle set as claimed in claim 27, wherein the inclination angle θ is in a range of about 15° to about 60°.

29. The nozzle set as claimed in claim 26, wherein the source gas injection nozzle has a slope inclined toward the purge gas injection nozzle.

30. The nozzle set as claimed in claim 29, wherein the slope has an inclination angle $\theta$ larger than about 0° and smaller than about 90° with respect to a substantially perpendicular direction.

31. The nozzle set as claimed in claim 30, wherein the inclination angle $\theta$ is in a range of about 15° to about 60°.

* * * * *